United States Patent
Jung et al.

(10) Patent No.: US 7,447,416 B2
(45) Date of Patent: Nov. 4, 2008

(54) LIGHT EMITTING ASSEMBLY, BACKLIGHT UNIT AND DISPLAY HAVING THE SAME

(75) Inventors: Il-yong Jung, Suwon-si (KR); Tae-hee Cho, Seoul (KR); Jong-min Wang, Seongnam-si (KR); Ji-whan Noh, Suwon-si (KR); Su-gun Kim, Hwaseong-si (KR); Ki-burn Seong, Anyang-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 134 days.

(21) Appl. No.: 11/386,785

(22) Filed: Mar. 23, 2006

(65) Prior Publication Data

US 2006/0215405 A1  Sep. 28, 2006

Related U.S. Application Data

(60) Provisional application No. 60/664,193, filed on Mar. 23, 2005.

(30) Foreign Application Priority Data

Sep. 15, 2005  (KR) .................. 10-2005-0086242

(51) Int. Cl.
*G02B 6/10* (2006.01)
*F21V 9/00* (2006.01)
*F21V 21/00* (2006.01)

(52) U.S. Cl. .............. 385/146; 385/147; 362/231; 362/241; 362/249; 362/297

(58) Field of Classification Search ............. 385/88–94, 385/146, 147; 362/227, 228, 231, 234, 235, 362/236, 237, 240, 241, 243, 247, 249, 296, 362/297

See application file for complete search history.

(56) References Cited

U.S. PATENT DOCUMENTS

| | | | |
|---|---|---|---|
| 5,822,053 | A | 10/1998 | Thrailkill |
| 6,443,597 | B1 | 9/2002 | Natori |
| 6,857,767 | B2 | 2/2005 | Matsui et al. |
| 6,923,548 | B2 | 8/2005 | Lim |
| 7,140,751 | B2 | 11/2006 | Lin |
| 2002/0071288 | A1 | 6/2002 | Lim |
| 2002/0135298 | A1 | 9/2002 | Pelka et al. |
| 2003/0052594 | A1 | 3/2003 | Matsui et al. |
| 2004/0027782 | A1 | 2/2004 | Erhardt et al. |
| 2004/0032388 | A1 | 2/2004 | Tsai et al. |

(Continued)

FOREIGN PATENT DOCUMENTS

CN  2544172  8/2004

(Continued)

*Primary Examiner*—Kevin S Wood
(74) *Attorney, Agent, or Firm*—Sughrue Mion, PLLC

(57) ABSTRACT

A light emitting assembly, a backlight unit, and a display are provided. The light emitting assembly includes: light emitting modules, wherein the light emitting modules include: a substrate having an electrical connecting portion; and a plurality of light emitting units arranged on the substrate, and wherein the light emitting modules can be assembled using the electrical connecting portion. The light emitting assembly can be assembled using the light emitting modules comprised of independent blocks and thus, can be freely used regardless of the size of the display.

10 Claims, 3 Drawing Sheets

U.S. PATENT DOCUMENTS

| | | |
|---|---|---|
| 2004/0062040 A1 | 4/2004 | Blume et al. |
| 2004/0201987 A1 | 10/2004 | Omata |
| 2004/0228127 A1 | 11/2004 | Squicciarini |
| 2004/0257329 A1 | 12/2004 | Park et al. |
| 2005/0248524 A1 | 11/2005 | Feng et al. |

FOREIGN PATENT DOCUMENTS

| | | |
|---|---|---|
| DE | 10242292 A1 | 4/2004 |
| EP | 1162400 A3 | 4/2004 |
| EP | 1 433 877 A1 | 6/2004 |
| EP | 1 455 002 A1 | 9/2004 |
| JP | 61-084880 A | 4/1986 |
| JP | 2000-068562 A | 3/2000 |
| JP | 2000-353405 A | 12/2000 |
| JP | 2003-016808 A | 1/2003 |
| JP | 2004-029141 A | 1/2004 |
| JP | 2004233809 A | 8/2004 |
| JP | 2004-246117 A | 9/2004 |
| KR | 97-706515 A | 11/1997 |
| KR | 1998-076384 A | 11/1998 |
| KR | 2002-0019579 A | 3/2002 |
| KR | 10-2002-0041480 A | 6/2002 |
| KR | 20030051898 A | 7/2003 |
| KR | 2004-0090083 A | 10/2004 |
| KR | 2004-0096186 A | 11/2004 |
| WO | 2004/049292 A1 | 6/2004 | ial Application No. 60/664,193, filed on Mar. 23, 2005, in the US PTO, the disclosures of which are incorporated herein in their entirety by reference.

LIGHT EMITTING ASSEMBLY, BACKLIGHT UNIT AND DISPLAY HAVING THE SAME

CROSS-REFERENCE TO RELATED PATENT APPLICATIONS

This application claims priority from Korean Patent Application No. 10-2005-0086242, filed on Sep. 15, 2005, in the Korean Intellectual Property Office, and U.S. Provisional Application No. 60/664,193, filed on Mar. 23, 2005, in the US PTO, the disclosures of which are incorporated herein in their entirety by reference.

BACKGROUND OF THE INVENTION

1. Field of the Invention

The present invention relates to a light emitting assembly that can be easily assembled according to the size of display to be used as a light source, a backlight unit and a display having the same.

2. Description of the Related Art

In general, liquid crystal display (LCD) devices which are a type of flat panel displays are light receiving type displays that are not self-luminescent but form an image using incident light from the outside. LCD devices are used in notebooks, desktop computers, LCD-TVs, and mobile communication terminals and require backlight units besides liquid crystal panels. Backlight units are installed on a rear side of the LCD device and radiate light onto a liquid crystal panel.

Backlight units can be mainly classified into direct light type backlight units that radiate light emitted from a plurality of light sources directly installed under an LCD device onto a liquid crystal panel, and edge light type backlight units that transmit light emitted from a light source installed at sidewalls of a light guide panel (LGP) onto the liquid crystal panel, according to the arrangement of a light source. A cold cathode fluorescent lamp (CCFL) is used as a light source in edge light type backlight units. The CCFL has low color reproduction and thus is not suitable for a high picture-quality and high-resolution TV or monitor. Accordingly, a light emitting diode (LED) has been spotlighted as a light source that replaces the CCFL.

Referring to FIG. 1A, a conventional edge light type backlight unit 20 includes a plurality of LEDs 10 arranged on a PCB substrate 5 and a light guide panel 15 that guides light emitted from the LEDs 10 to be incident on a liquid crystal panel. The LEDs 10 are arranged in a plurality of columns and rows, as illustrated in FIG. 1B. The LEDs 10 include LEDs that produce red, green, and blue colored light. The red, green, and blue colored light is mixed on the light guide panel 15, thereby realizing white light.

However, in the conventional edge light type backlight unit, LEDs are arranged on a PCB substrate manufactured to a predetermined size according to the size of a display screen so as to produce a light source. Thus, since an LED substrate having different sizes should be manufactured according to the size of a display screen, a production line should be constituted according to the size of the display screen. Thus, manufacturing costs increase, and due to the size of the display screen, the frequency of the LED substrate that can be commonly used is reduced. In addition, when defects occur in a portion of LEDs, the entire LED substrate should be replaced and it is difficult to manage defects.

SUMMARY OF THE INVENTION

The present invention provides a light emitting module that can be effectively used regardless of the size of a display screen, a backlight unit and a display having the same.

According to an aspect of the present invention, there is provided a light emitting assembly including light emitting modules, wherein the light emitting modules include: a substrate having an electrical connecting portion; and a plurality of light emitting units arranged on the substrate, and wherein the light emitting modules are operative to be assembled using the electrical connecting portion.

The light emitting units may include at least one of: a base; a plurality of light emitting elements arranged on the base and irradiating light having at least two wavelengths; and a cap arranged above the light emitting elements and totally reflecting light emitted from the light emitting elements.

The light emitting elements may not be disposed in a center of the base but on inner circumferences thereof.

The cap may be in the form of, for example, a cone, a polygonal pyramid, and a dome.

The light emitting elements may include: a first light emitting element irradiating light in a red wavelength region; a second light emitting element irradiating light in a green wavelength region; and a third light emitting element irradiating light in a blue wavelength region.

According to another aspect of the present invention, there is provided a backlight unit irradiating light onto a display, the backlight unit including: a light emitting assembly having light emitting modules, wherein the light emitting modules include: a substrate having an electrical connecting portion; and a plurality of light emitting units arranged on the substrate, and wherein the light emitting modules are operative to be assembled using the electrical connecting portion; and a light guide panel guiding light emitted from the light emitting assembly.

According to another aspect of the present invention, there is provided a display, the display including: a backlight unit, wherein the backlight unit includes: a light emitting assembly having light emitting modules, wherein the light emitting modules include: a substrate having an electrical connecting portion; and a plurality of light emitting units arranged on the substrate, and wherein the light emitting modules are operative to be assembled using the electrical connecting portion; and a light guide panel guiding light emitted from the light emitting assembly; and a display panel forming an image using light irradiated from the backlight unit.

BRIEF DESCRIPTION OF THE DRAWINGS

The above and other features and advantages of the present invention will become more apparent by describing in detail exemplary embodiments thereof with reference to the attached drawings, in which.

DETAILED DESCRIPTION OF ILLUSTRATIVE, NON-LIMITING EMBODIMENTS OF THE INVENTION

Figure 1A:
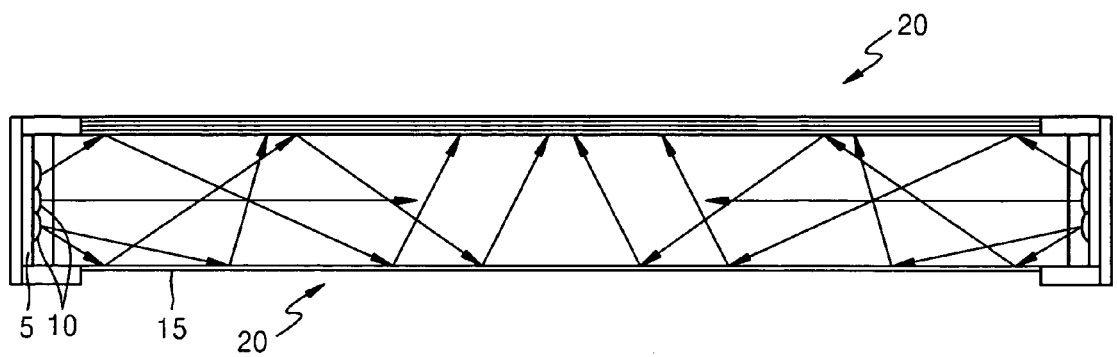
FIG. 1A illustrates a conventional edge light type backlight unit.
Figure 1B:
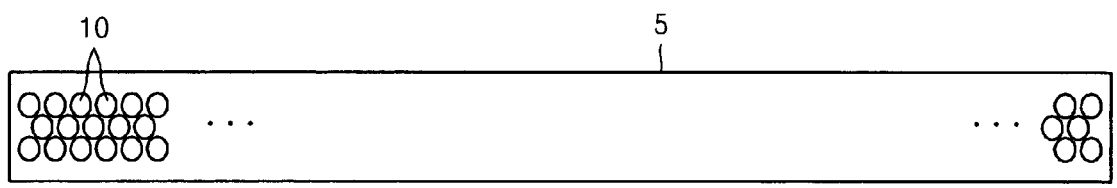
FIG. 1B illustrates a light source illustrated in FIG. 1A.
Figure 2A:
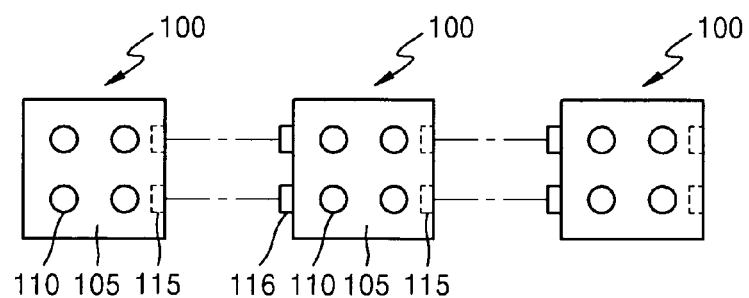
FIG. 2A illustrates a light emitting module used in a light emitting assembly according to an exemplary embodiment of the present invention.
Figure 2B:
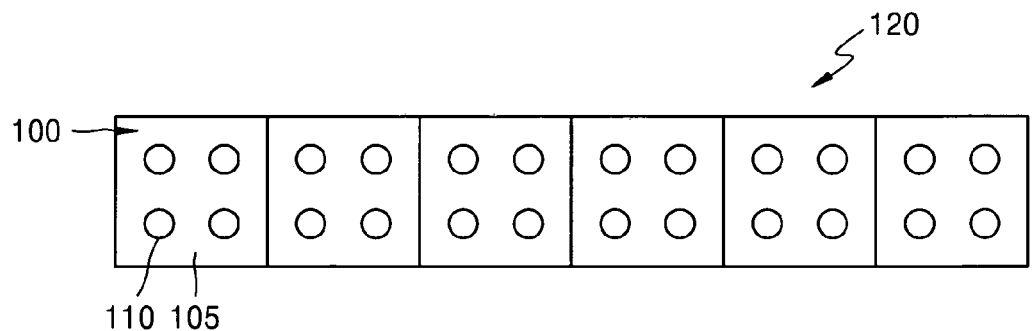
FIG. 2B illustrates a light emitting assembly according to an exemplary embodiment of the present invention.

Referring to FIGS. 2A and 2B, a light emitting assembly 120 according to an exemplary embodiment of the present invention can be configured to a desired size by connecting a plurality of light emitting modules 100 that can be assembled. Each of the light emitting modules 100 includes a plurality of light emitting elements 110 arranged on a substrate 105 and electrical connecting portions 115 and 116 for electrically connecting the light emitting modules 100 to the substrate 105. The electrical connecting portions 115 and 116 include a first connecting portion 115 and a second connecting portion 116 that can be pair-combined so as to connect adjacent light emitting modules. The number of the light emitting elements 110 shown in FIG. 2A is 4, but is not limited to this number and can be changed in various ways.

The substrate 105 may be a printed circuit board (PCB). When the substrate 105 is manufactured as a PCB, an additional PCB is not required and thus, a structure of the light emitting assembly 120 can be further simplified. An additional PCB can also be used and the light emitting modules 100 can be combined with one another on the PCB.

The light emitting modules 100 may be multi-chip light emitting elements having a plurality of light emitting elements for irradiating light having at least two wavelengths. The light emitting elements may be light emitting diodes (LEDs), for example. In addition, each of the light emitting elements includes a cap for total reflecting light irradiated from the light emitting elements and totally reflects light having different wavelengths emitted from the light emitting elements several times inside the light emitting elements, thereby mixing light.

Figure 3A:
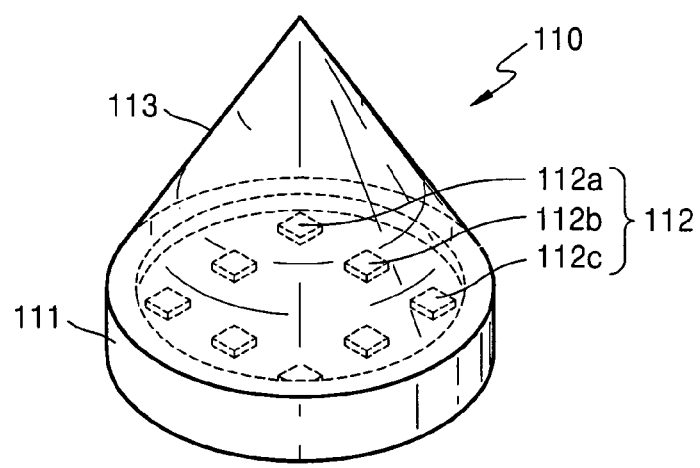
FIGS. 3A through 3C illustrate examples of light emitting units used in the light emitting module illustrated in FIG. 2A, respectively.
Figure 3B:
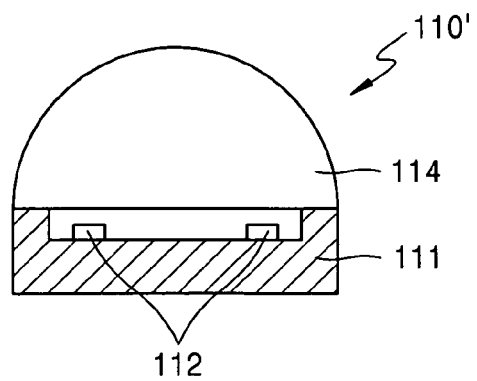
Figure 3C:
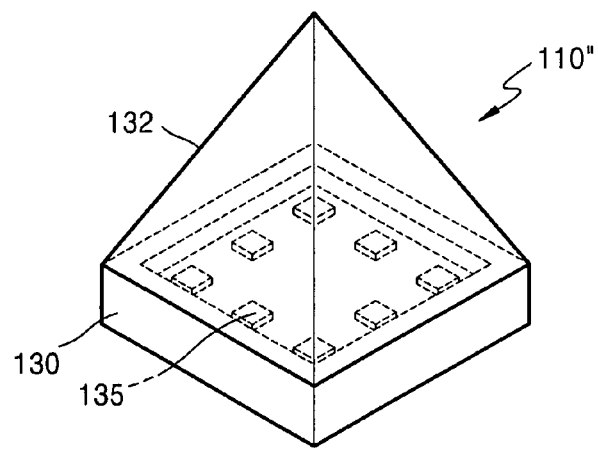

The light emitting elements may be packaged in various structures, and several examples thereof are illustrated in FIGS. 3A, 3B, and 3C. In the light emitting elements 110 illustrated in FIG. 3A, a plurality of light emitting elements 112 are arranged on a base 111, and a cap 113 is disposed above the light emitting elements 112.

The light emitting elements 112 are light emitting elements for emitting light having at least two different wavelengths. For example, the light emitting elements 112 include a first light emitting element 112a for emitting light in a red wavelength range, a second light emitting element 112b for emitting light in a green wavelength range, and a third light emitting element 112c for emitting light in a blue wavelength range.

In FIG. 3A, the light emitting elements 112 include eight light emitting elements, that is, first, three light emitting elements 112a, second, two light emitting elements 112b, and third, three light emitting elements 112c. The number or arrangement shape of light emitting elements for each wavelength range can be changed according to a desired color temperature range in consideration of the amount of light emitted from light emitting elements for each wavelength range. Consistent with the present invention, since the degree of freedom that light emitting elements for emitting light in a plurality of wavelength ranges are formed in various arrangement methods and arrangement numbers and can be set as light emitting elements is large, colors can be easily realized and a manufacturer can select colors in a wide range. In addition, even when light emitting elements are configured in a multi-chip structure, the size of the light emitting elements is not greatly changed compared to light emitting diodes having single chips, there is no reason to worry about a volume increase.

Light emitted from the light emitting elements passes through the cap 113 and is totally reflected inside the cap 113 several times and mixed with one another. The cap 113 is formed of a transparent material having a larger refraction index than an adjacent external medium and may be a lens, for example. In addition, while the cap 113 is shown formed in a conic shape, it is not limited to this shape and can be formed in various other shapes. For example, a light emitting element 110' illustrated in FIG. 3B includes a dome-shaped cap 114, or a light emitting element 110" illustrated in FIG. 3C includes a polygonal pyramid cap. In FIG. 3C, a plurality of light emitting elements 135 are disposed on a rectangular base 130 and a pyramid cap 132 is disposed above the base 130.

The light emitting elements 112 and 135 are not disposed in the center of the bases 111 and 130, but rather on inner circumferences of the base 111 and 130. The light emitting elements are not disposed in the center of the bases 111 and 130 so that spots can be prevented from being formed. The spots are formed when light emitted from a light emitting element is not uniformly diffused and irradiated at relatively high brightness and shown as partially-bright spots and thus cause the image quality to be degraded. When the light emitting elements are disposed in the center of the bases 111 and 130 and light is irradiated from the light emitting element disposed in the center, most of the light is incident on vertexes of the caps 113, 114, and 132 and not totally reflected and passes through the caps 113, 114, and 132. That is, when the light emitting elements are disposed in the center of the bases 111 and 130 corresponding to the centers of the caps 113, 114, and 132, most of the light emitted from the light emitting elements is incident at a smaller angle than critical angles of the caps 113, 114, and 132 and thus passes through the caps 113, 114, and 132 and goes straight or is refracted. On the contrary, when the light emitting elements are disposed on outer circumferences of the bases 111 and 130, most of the light emitted from light emitting elements is incident at a larger angle than the critical angles of the caps 113, 114, and 132 and totally reflected inside the caps 113, 114, and 132.

Since light having different wavelengths emitted from the light emitting elements 112 and 135 is totally reflected several times inside the caps 113, 114, and 132 and discharged to the outside of the caps 113, 114, and 132, space for mixing colored light can be remarkably reduced whereby the size of a display screen can be reduced.

Figure 4:
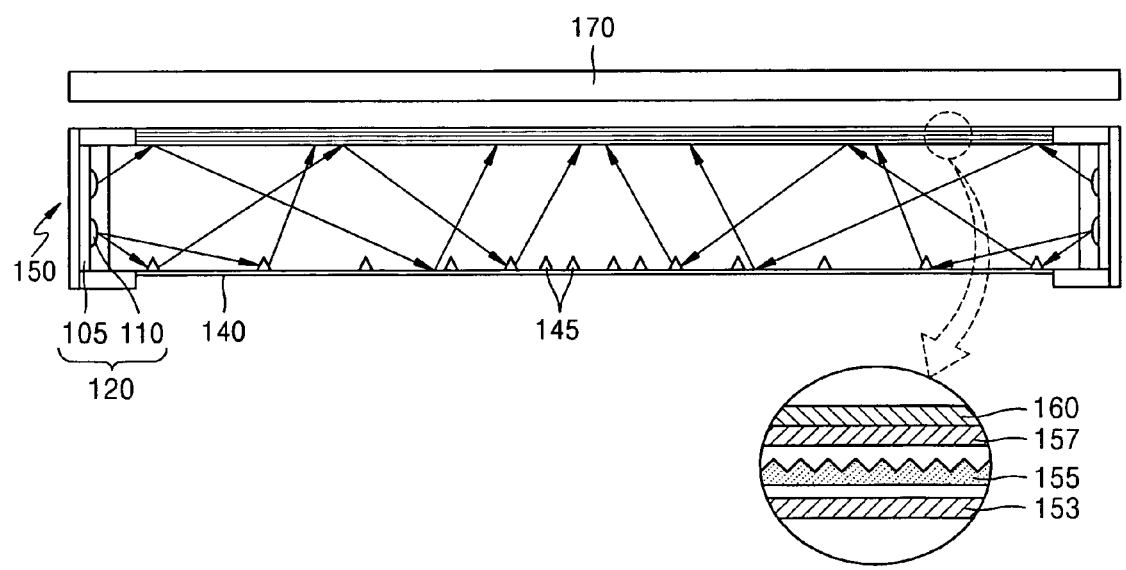
FIG. 4 is a schematic view of a display according to an exemplary embodiment of the present invention.

Referring to FIG. 4, a display includes a backlight unit 150 and a display panel 170 for forming an image using light irradiated from the backlight unit 150. The backlight unit 150 includes a light emitting assembly 120 assembled in light emitting modules 100 and a light guide panel 140 for guiding light irradiated from the light emitting assembly 120 to be directed to the display panel 170.

A diffusion panel 153 for diffusing light, a prism sheet 155 for correcting the path of light, and a brightness enhancement film (BEF) 157 for enhancing directivity so as to make light passing through the prism sheet 155 be directed to the display panel 170 are disposed between the light guide panel 140 and the display panel 170. The BEF 157 refracts and condenses light emitting from the diffusion panel 153 to enhance the directivity of light, thereby increasing brightness.

The display panel 170 may be a liquid crystal panel, for example. When the display panel 170 is a liquid crystal panel, a polarization enhancement film 160 for enhancing polarization efficiency may be further disposed above the BEF 157. The polarization enhancement film 160 transmits p-polarized light and reflects s-polarized light so that most of the incident light is emitted as light polarized in one direction, for example, p-polarized light.

A prism pattern 145 may be formed on the bottom surface of the light guide panel 140. The prism pattern 145 prevents the intensity of light, when light emitted from the light emitting assembly 120 is reflected through the light guide panel 140, from being decreased as the prism pattern 145 is distant from the light emitting assembly 120, thereby enhancing uniformity of light. The prism pattern 145 is more densely arranged as it is distant from the light emitting assembly 120. In addition, when the light emitting assembly 120 is disposed at both sides of the light guide panel 140, the prism pattern 145 may be symmetrical with the center line of the light guide panel 140.

As described above, the light emitting assembly consistent with the present invention can be assembled in various shapes according to the size of a display screen using blocked light emitting modules and thus can be very efficiently used. In addition, in order to improve relatively low brightness at edges of the backlight unit, the magnitude of current to be supplied to light emitting modules disposed at the edges of the light emitting assembly can be larger than that of current to be supplied to the remaining light emitting modules. This is because the supply of current can be controlled independently in each light emitting module.

Furthermore, the light assembly consistent with the present invention can be used in a direct light type backlight unit besides an edge light type backlight unit.

The light emitting assembly according to the present invention can be assembled using light emitting modules comprised of independent blocks and thus, can be freely used regardless of the size of the display screen and when defective elements occur, the light emitting assembly can be easily replaced with another one. Thus, since different production lines don't need to be disposed to produce light sources used in a backlight unit according to the size of a display screen, manufacturing costs can be remarkably reduced. Furthermore, since light emitting modules can be independently driven, a relatively large current is supplied to the light emitting modules disposed at edges of the light emitting assembly compared to other light emitting modules such that spots can be prevented from being formed at the edges.

The size of a light emitting assembly is selected and thus can be widely used in the backlight unit and the display.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A light emitting assembly comprising light emitting modules,
    wherein each light emitting module comprises:
        a substrate comprising an electrical connecting portion; and
        a plurality of light emitting units arranged on the substrate,
    wherein the light emitting modules are operative to be connected with each other through the electrical connecting portion, and
    wherein each light emitting unit comprises:
        a base;
        a plurality of light emitting elements which are arranged on the base and which irradiate light having at least two wavelengths; and
        a cap which is arranged above the light emitting elements and which totally internally reflects light emitted from the light emitting elements; wherein the cap comprises a lens; and
    wherein the light emitting elements are not disposed in a center of the base but on inner circumferences thereof.

2. The light emitting assembly of claim 1, wherein the cap is in the form of at least one of a cone, a polygonal pyramid, and a dome.

3. The light emitting assembly of claim 1, wherein each light emitting element comprises:
    a first light emitting element which irradiates light in a red wavelength region;
    a second light emitting element which irradiates light in a green wavelength region; and
    a third light emitting element which irradiates light in a blue wavelength region.

4. The light emitting assembly of claim 1, wherein the substrate comprises a printed circuit board (PCB).

5. A backlight unit which irradiates light onto a display, the backlight unit comprising:
    a light emitting assembly comprising light emitting modules, and
    a light guide panel which guides light emitted from the light emitting assembly,
    wherein each light emitting module comprises:
        a substrate comprising an electrical connecting portion; and
        a plurality of light emitting units arranged on the substrate, and
    wherein the light emitting modules are operative to be connected with each other through the electrical connecting portion, and
    wherein each light emitting unit comprises:
        a base;
        a plurality of light emitting elements which are arranged on the base and which irradiate light having at least two wavelengths; and
        a cap which is arranged above the light emitting elements and which totally internally reflects light emitted from the light emitting elements; wherein the cap comprises a lens; and
    wherein the light emitting elements are not disposed in a center of the base but on inner circumferences thereof.

6. The backlight unit of claim 5, further comprising a diffusion panel which is disposed above the light guide panel and which diffuses and transmits incident light.

7. The backlight unit of claim 6, wherein the cap is in the form of at least one of a cone, a polygonal pyramid, and a dome.

8. The backlight unit of claim 6, wherein each light emitting element comprises:
    a first light emitting element which irradiates light in a red wavelength region;
    a second light emitting element which irradiates light in a green wavelength region; and
    a third light emitting element which irradiates light in a blue wavelength region.

9. A display comprising:
    a backlight unit,
    a light guide panel which guides light emitted from the light emitting assembly; and
    a display panel which forms an image using light irradiated from the backlight unit;
    wherein the backlight unit comprises a light emitting assembly comprising light emitting modules,
    each light emitting module comprises:

a substrate comprising an electrical connecting portion; and a plurality of light emitting units arranged on the substrate, and wherein the light emitting modules are operative to be connected with each other through the electrical connecting portion, and wherein each light emitting unit comprises:

a base;

a plurality of light emitting elements which are arranged on the base and which irradiate light having at least two wavelengths; and a cap which is arranged above the light emitting elements and which totally internally reflects light emitted from the light emitting elements; wherein the cap comprises a lens; and wherein the light emitting elements are not disposed in a center of the base but on inner circumferences thereof.

10. The display of claim 9, further comprising a diffusion panel which is disposed above the light guide panel and which diffuses and transmits incident light.

* * * * *